(12) United States Patent
Ikeda et al.

(10) Patent No.: US 12,407,078 B2
(45) Date of Patent: Sep. 2, 2025

(54) TUNER, AND IMPEDANCE MATCHING METHOD

(71) Applicant: TOKYO ELECTRON LIMITED, Tokyo (JP)

(72) Inventors: Taro Ikeda, Nirasaki (JP); Eiki Kamata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 262 days.

(21) Appl. No.: 18/026,103

(22) PCT Filed: Sep. 6, 2021

(86) PCT No.: PCT/JP2021/032597
§ 371 (c)(1),
(2) Date: Mar. 13, 2023

(87) PCT Pub. No.: WO2022/059533
PCT Pub. Date: Mar. 24, 2022

(65) Prior Publication Data
US 2023/0335876 A1    Oct. 19, 2023

(30) Foreign Application Priority Data
Sep. 18, 2020 (JP) .................................. 2020-157513

(51) Int. Cl.
*H01P 3/06*        (2006.01)
*H01J 37/32*       (2006.01)

(52) U.S. Cl.
CPC ............ *H01P 3/06* (2013.01); *H01J 37/3222* (2013.01)

(58) Field of Classification Search
CPC ............ H01J 37/3222; H01J 37/32192; H01J 37/32935; H01J 37/32229;
(Continued)

(56) References Cited

U.S. PATENT DOCUMENTS 11,972,929 B2 *   4/2024   Wada .................... C23C 16/274
2019/0186747 A1 * 6/2019   Lowery ................ H05H 1/2441

FOREIGN PATENT DOCUMENTS

WO      WO 2008/013112 A1      1/2008

OTHER PUBLICATIONS

PCT International Search Report and Written Opinion, PCT Application No. PCT/JP2021/032597, Nov. 2, 2021, 8 pages (with English translation of PCT International Search Report).

* cited by examiner

*Primary Examiner* — Lincoln D Donovan
*Assistant Examiner* — Tyler J Pereny
(74) *Attorney, Agent, or Firm* — Fenwick & West LLP

(57) ABSTRACT

There is provided a tuner that forms a part of an electromagnetic wave transmission path for supplying electromagnetic waves from a power supply to a load, and that matches an impedance on a power supply side and an impedance on a load side, comprising: a coaxial line including a cylindrical inner conductor and a cylindrical outer conductor disposed coaxially outside the inner conductor; an annular first dielectric constant changing material disposed in a space between the inner conductor and the outer conductor of the coaxial line, and having a variable dielectric constant; an annular second dielectric constant changing material spaced apart from the first dielectric constant changing material in a line length direction of the coaxial line, disposed in the space between the inner conductor and the outer conductor of the coaxial line, and having a variable dielectric constant; a first power supply portion configured to supply power to the first dielectric constant changing material; and a second power supply portion configured to supply power to the second dielectric constant changing material.

19 Claims, 11 Drawing Sheets

(58) Field of Classification Search
CPC .......... H01J 37/32256; H01J 37/32311; H01J 2237/24564; H01J 37/32201; H01J 37/32266; H01J 37/32275; H01J 37/32293; H01J 37/32972; H05H 1/46; H05H 1/4615; H01L 21/3065; H01L 21/67253; H01P 1/18; H01P 5/04; H01P 5/12; H01P 3/06
See application file for complete search history.

TUNER, AND IMPEDANCE MATCHING METHOD

TECHNICAL FIELD

The present disclosure relates to a tuner and an impedance matching method.

BACKGROUND

Plasma processing is widely used as processing for semiconductor wafers. Microwave plasma, which is capable of generating high-density plasma having a low electron temperature, is attracting attention as a plasma processing apparatus for performing plasma processing. As the plasma processing apparatus using microwave plasma, Patent Document 1 discloses a plasma processing apparatus including a microwave output part for distributing and outputting microwaves to multiple microwaves, and a plurality of antenna modules for guiding the distributed multiple microwaves into a chamber. Each antenna module includes an amplifier for amplifying microwaves, an antenna part for radiating the amplified microwaves into the chamber, and a tuner for adjusting an impedance on a microwave transmission path. In Patent Document 1, a slug tuner for performing impedance matching using a slug moving on the microwave transmission path is used as a tuner.

PRIOR ART DOCUMENTS

Patent Documents

Patent Document 1: International Publication No. 2008/013112

SUMMARY

Problems to be Resolved by the Invention

The present disclosure provides a tuner and an impedance matching method in which mechanical consumption of members is less likely to occur and an impedance matching speed is high.

Means for Solving the Problems

In one exemplary embodiment, a tuner that forms a part of an electromagnetic wave transmission path for supplying electromagnetic waves from a power supply to a load, and that matches an impedance on a power supply side and an impedance on a load side, comprising: a coaxial line including a cylindrical inner conductor and a cylindrical outer conductor disposed coaxially outside the inner conductor; an annular first dielectric constant changing material disposed in a space between the inner conductor and the outer conductor of the coaxial line, and having a variable dielectric constant; an annular second dielectric constant changing material spaced apart from the first dielectric constant changing material in a line length direction of the coaxial line, disposed in the space between the inner conductor and the outer conductor of the coaxial line, and having a variable dielectric constant; a first power supply portion configured to supply power to the first dielectric constant changing material; and a second power supply portion configured to supply power to the second dielectric constant changing material.

Effect of the Invention

In accordance with the present disclosure, a tuner and an impedance matching method in which mechanical consumption of members is less likely to occur and an impedance matching speed is high are provided.

DETAILED DESCRIPTION

Hereinafter, embodiments will be described in detail with reference to the accompanying drawings.

First Embodiment

Figure 1:
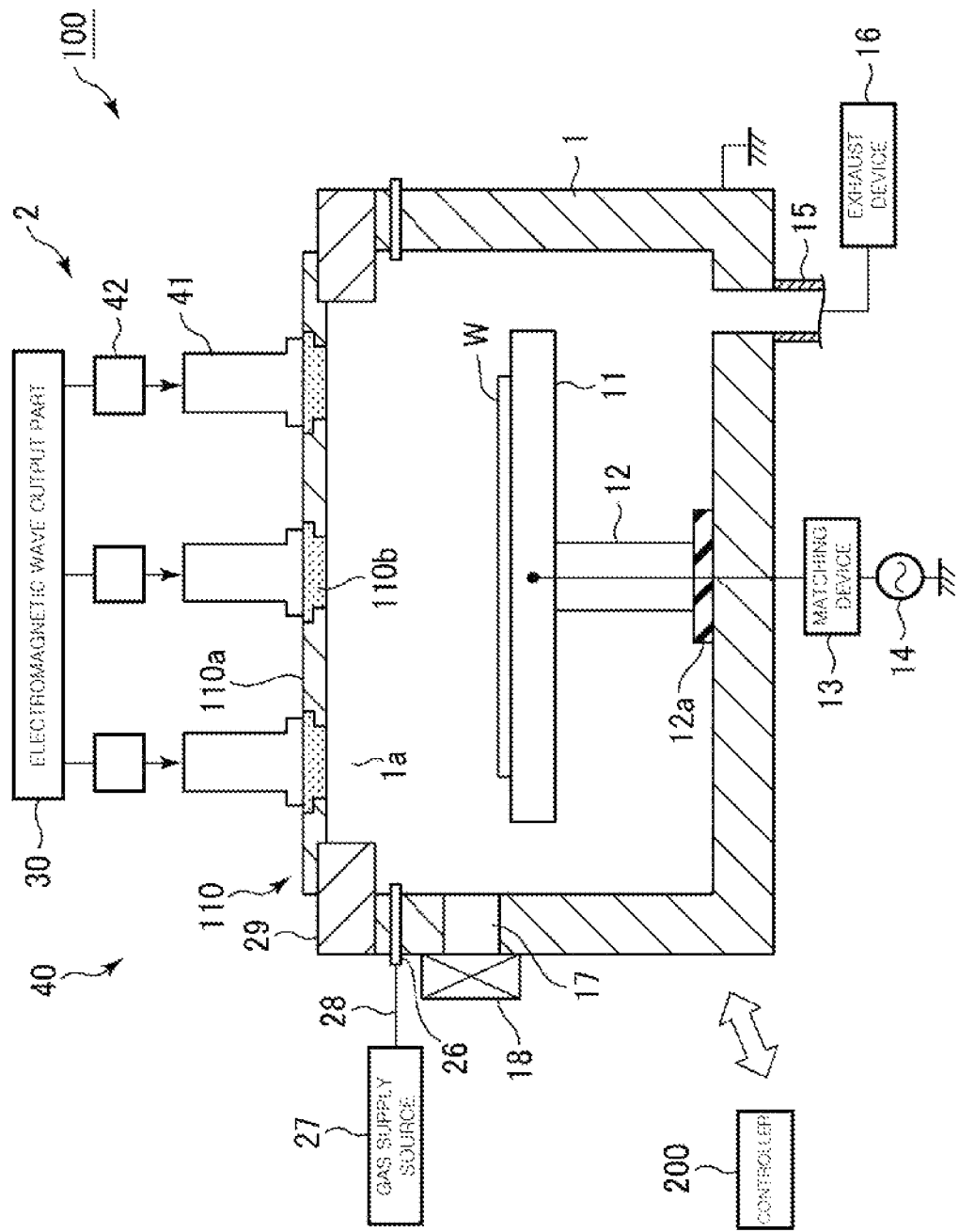
FIG. 1 is a cross-sectional view showing a schematic configuration of a plasma processing apparatus according to a first embodiment.
Figure 2:
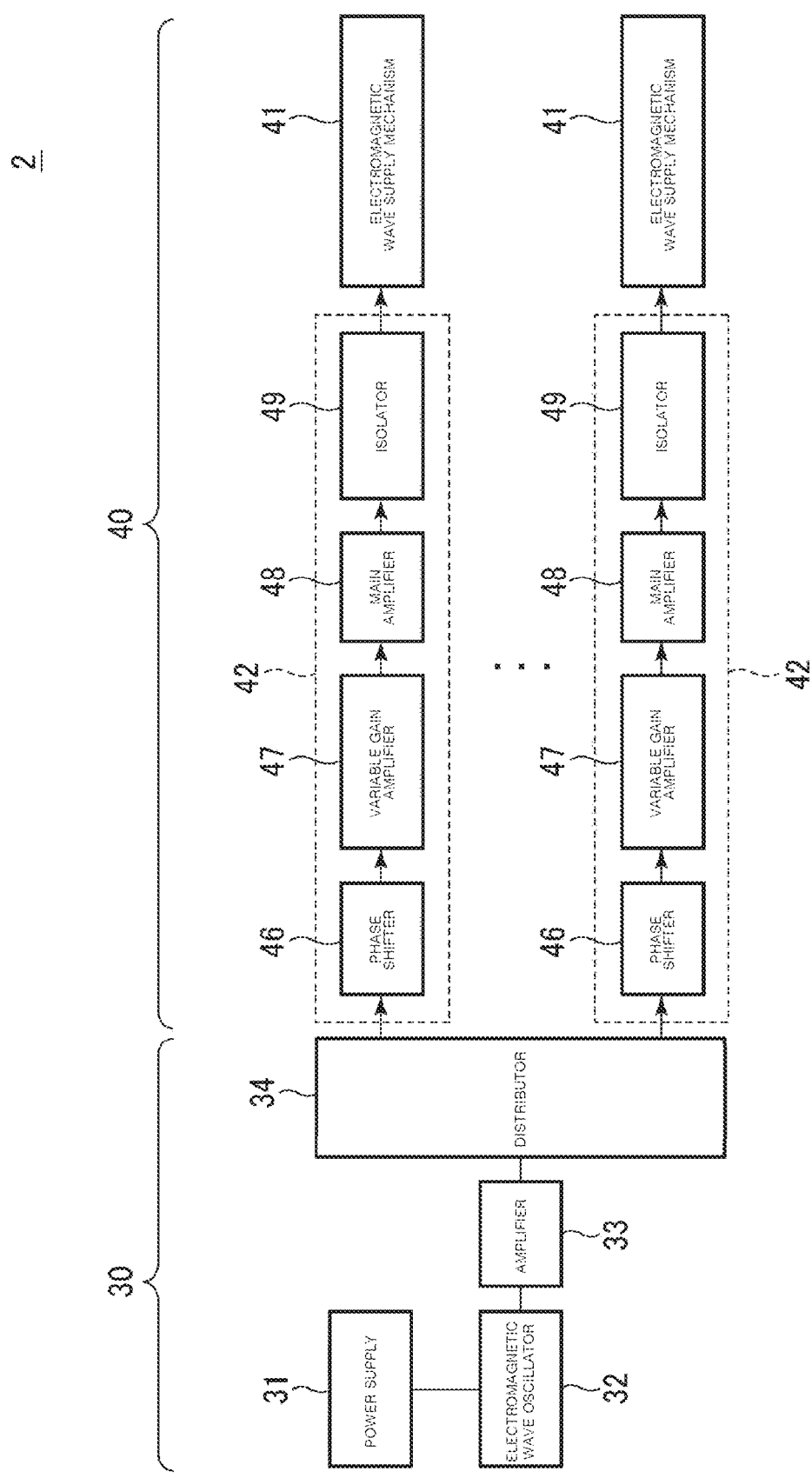
FIG. 2 is a block diagram showing a configuration of a plasma source used in the plasma processing apparatus of FIG. 1.
Figure 3:
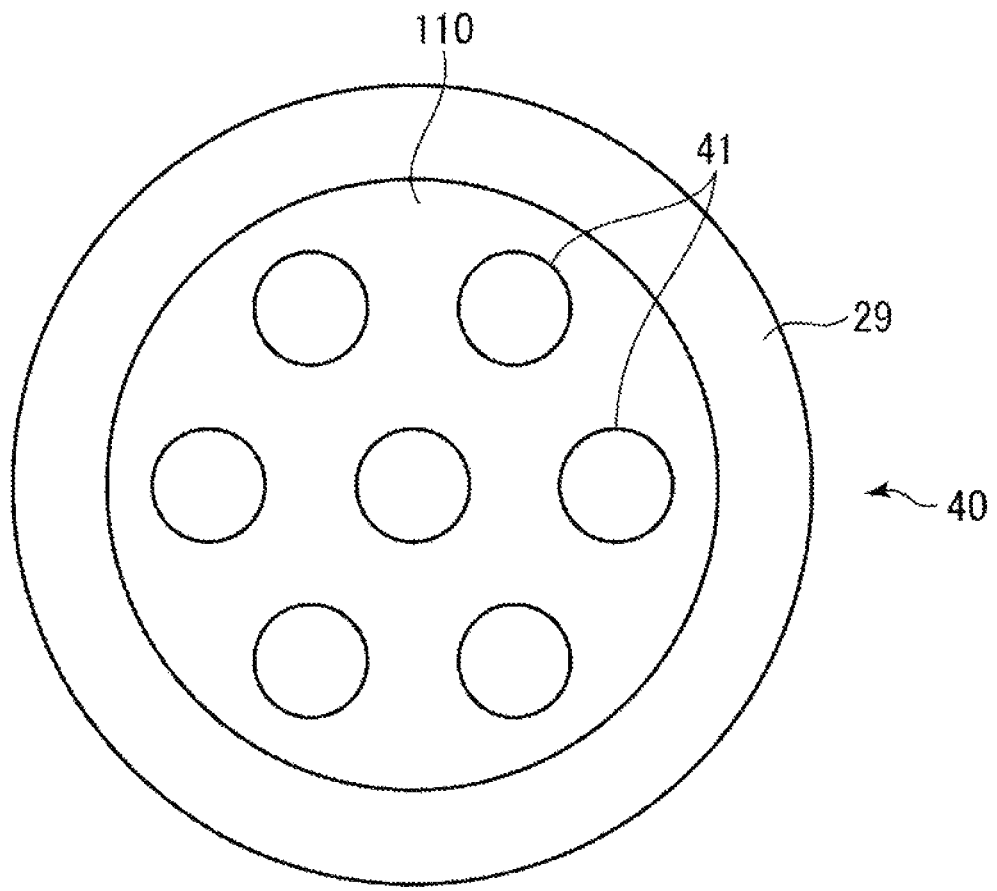
FIG. 3 is a plan view schematically showing an electromagnetic wave supply part in the plasma source.

First, a first embodiment will be described.
[Plasma Processing Apparatus]
FIG. 1 is a cross-sectional view showing a schematic configuration of a plasma processing apparatus. FIG. 2 is a block diagram showing a configuration of a plasma source used in the plasma processing apparatus of FIG. 1. FIG. 3 is a plan view schematically showing an electromagnetic wave supply part in the plasma source.

A plasma processing apparatus 100 produces plasma (mainly, surface wave plasma) using electromagnetic waves (microwaves), and performs plasma processing, for example, etching or film formation such as ALD on a substrate W using the produced surface wave plasma. A typical example of the substrate W is a semiconductor wafer, but the substrate W is not limited thereto, and may be another substrate such as a flat panel display (FPD) substrate, a ceramic substrate, or the like.

A stage 11 for horizontally supporting the wafer W is disposed in the chamber 1 while being supported by a cylindrical support member 12 installed at the center of the bottom portion of the chamber 1 via an insulating member 12a. The stage 11 and the support member 12 may be made of, e.g., aluminum having an anodically oxidized surface or the like.

Although not shown, the stage 11 is provided with an electrostatic chuck for electrostatically attracting the wafer W, a temperature control mechanism, a gas channel for supplying a heat transfer gas to the backside of the substrate W, lift pins that are raised and lowered to transfer the substrate, or the like. Further, a radio frequency (RF) bias power supply 14 is electrically connected to the stage 11 through a matching device 13. Ions in the plasma are attracted to the substrate W by supplying an RF power from the RF bias power supply 14 to the stage 11.

An exhaust line 15 is connected to the bottom portion of the chamber 1, and an exhaust device 16 including a vacuum pump is connected to the exhaust line 15. By operating the exhaust device 16, a gas in the chamber 1 is exhausted, and a pressure in the chamber 1 can be quickly reduced to a predetermined vacuum level. In addition, a loading/unloading port 17 for loading/unloading the substrate W, and a gate valve 18 for opening/closing the loading/unloading port 17 are disposed on the sidewall of the chamber 1.

At an upper portion of the chamber 1, a ring-shaped gas inlet member 26 is disposed along a chamber wall, and a plurality of gas injection holes are formed on an inner circumferential surface of the gas inlet member 26. A gas supply source 27 for supplying a gas such as a plasma generating gas, a processing gas, or the like is connected to the gas inlet member 26 through a line 28. A noble gas such as Ar gas or the like may be appropriately used as the plasma generating gas. The processing gas is appropriately selected depending on types of plasma processing.

A plasma source 2 is disposed above the chamber 1 to radiate electromagnetic waves into the chamber 1 and produce plasma using an electric field. The plasma generating gas introduced from the gas inlet member 26 into the chamber 1 is turned into plasma by electromagnetic waves introduced from the plasma source 2 into the chamber 1. When a processing gas is introduced from the gas inlet member 26, the processing gas is excited by the plasma of the plasma generating gas and turned into plasma, and the substrate W is subjected to plasma processing using the plasma of the processing gas.

Individual components of the plasma processing apparatus 100 are controlled by a controller 200 having a microprocessor. The controller 200 includes a storage device that stores a process sequence of the plasma processing apparatus 100 and a process recipe that is a control parameter, an input device, a display, and the like, and controls the plasma processing apparatus based on a selected process recipe.

[Plasma Source]

Next, the plasma source 2 will be described.

The plasma source 2 has a circular plate-shaped member 110 supported by a support ring 29 disposed at an upper portion of the chamber 1, and a seal ring is disposed between the support ring 29 and the plate-shaped member 110 to hermetically seal the gap therebetween. The plate-shaped member 110 also functions as a ceiling wall of the chamber 1. As shown in FIG. 2, the plasma source 2 includes an electromagnetic wave output part 30 for distributing and outputting electromagnetic waves to a plurality of paths, and an electromagnetic wave supply part 40 for supplying the electromagnetic waves outputted from the electromagnetic wave output part 30 into the chamber 1.

The electromagnetic wave output part 30 includes a power supply 31, an electromagnetic wave oscillator 32, an amplifier 33 for amplifying the oscillated electromagnetic waves, and a distributor 34 for distributing the amplified electromagnetic waves to a plurality of electromagnetic waves.

The electromagnetic wave oscillator 32 performs PLL oscillation of electromagnetic waves with a specific frequency (e.g., 860 MHz), for example. The distributor 34 distributes the electromagnetic waves amplified by the amplifier 33 while matching an impedance on an input side and an impedance on an output side to minimize the loss of the electromagnetic waves. The frequency of the electromagnetic waves may be within a frequency band of VHF waves and microwaves, specifically, within a range of 30 MHz to 3 THz.

The electromagnetic wave supply part 40 includes a plurality of amplifiers 42 for amplifying the electromagnetic waves distributed by the distributor 34 and an electromagnetic wave supply mechanisms 41 respectively connected to the amplifiers 42.

For example, as shown in FIG. 3, seven electromagnetic wave supply mechanisms 41, i.e., one electromagnetic wave supply mechanism 6 disposed at the center of the plate-shaped member 110 and six electromagnetic wave supply mechanisms 6 arranged in a circumferential direction of the plate-shaped member 110, are arranged on the plate-shaped member 110. The plate-shaped member 110 has a metal frame 110a and an electromagnetic wave transmitting window 110b that is fitted into the frame 110a and forms a part of the electromagnetic wave supply mechanism 41. The electromagnetic wave supply mechanism 41 will be described in detail later.

Each amplifier 42 includes a phase shifter 46, a variable gain amplifier 47, a main amplifier 48 constituting a solid state amplifier, and an isolator 49.

The phase shifter 46 is configured to change the phase of the electromagnetic waves. By adjusting the phase of the electromagnetic waves, the radiation characteristics can be modulated. For example, it is possible to change the plasma distribution by controlling directivity by adjusting the phase of each amplifier 42, or the phases of the amplifiers 42 adjacent to each other can be shifted by 90° to obtain circularly polarized waves. Further, the phase shifter 46 can be used for adjustment of delay characteristics between components in the amplifier and for spatial combination in the tuner. However, the phase shifter 46 may not be provided when it is unnecessary to modulate radiation characteristics or adjust delay characteristics between components in the amplifier.

The variable gain amplifier 47 adjusts the power level of the electromagnetic waves inputted to the main amplifier 48, and adjusts variation in individual antenna modules or plasma intensity. By changing the variable gain amplifier 47 for each amplifier 42, it is possible to create a distribution in the generated plasma.

The main amplifier 48 constituting a solid state amplifier may include an input matching circuit, a semiconductor amplifying element, an output matching circuit, and a high Q resonance circuit, for example.

The isolator 49 for separating reflected electromagnetic waves reflected from the electromagnetic wave supply mechanism 41 and directed toward the main amplifier 48 has a circulator and a dummy load (coaxial terminator). The circulator guides the electromagnetic waves reflected from an antenna part 45 of the electromagnetic wave supply mechanism 41, which will be described later, to the dummy load. The dummy load converts the reflected electromagnetic waves guided by the circulator into heat.

[Electromagnetic Wave Supply Mechanism]

Figure 4:
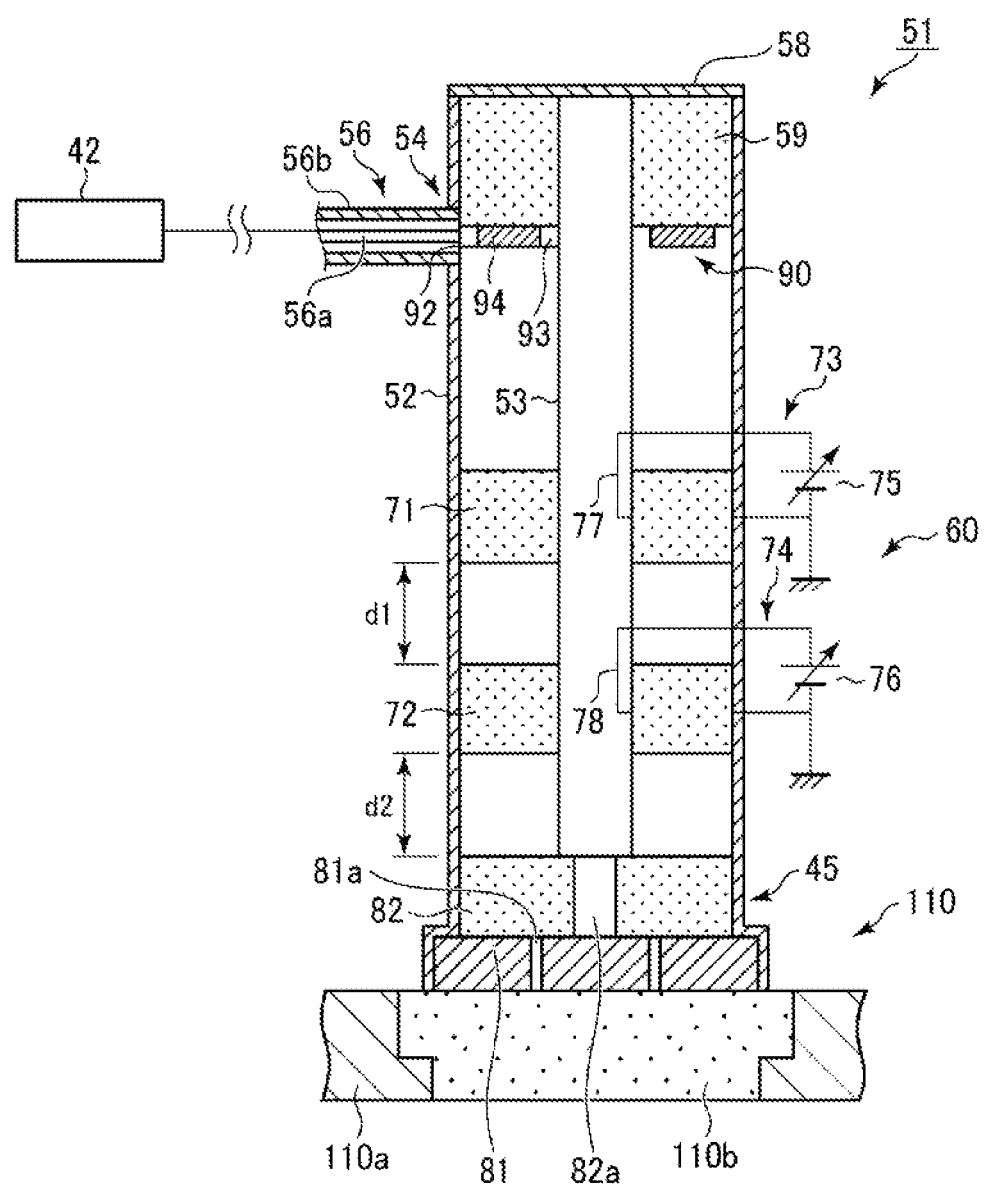
FIG. 4 is a cross-sectional view showing an electromagnetic wave supply mechanism (tuner) used in the first embodiment.

FIG. 4 is a cross-sectional view of an electromagnetic wave supply mechanism. The electromagnetic wave supply mechanism 41 supplies the electromagnetic waves supplied from the amplifier 42 into the chamber 1. The electromagnetic wave supply mechanism 41 includes a tuner 60 and the antenna part 45, as shown in FIG. 4.

The tuner 60 has a coaxial line 51, a first dielectric constant changing material 71, a second dielectric constant changing material 72, and power supply portions 73 and 74 respectively connected to the first dielectric constant changing material 71 and the second dielectric constant changing material 72. The tuner 60 will be described in detail later.

The coaxial line 51 for transmitting electromagnetic waves supplied from the amplifier 42 has a configuration in which a cylindrical outer conductor 52 and a cylindrical inner conductor 53 disposed at the center of the outer conductor 52 are coaxially arranged. The antenna part 45 is disposed at the tip end of the coaxial line 51. In the coaxial line 51, the inner conductor 53 serves as a power supply side and the outer conductor 52 serves as a ground side. The upper end of the coaxial line 51 serves as a reflecting plate 58.

A power supply port 54 for supplying electromagnetic waves into the coaxial line 51 is disposed on the base end side of the coaxial line 51. The power supply port 54 is connected to a power supply line 56 for supplying electromagnetic waves amplified by the amplifier 42. The power supply line 56 has a coaxial structure including an inner conductor 56a and an outer conductor 56b. In this example, the power supply port 54 has a power supply antenna 90 disposed at the tip end of the inner conductor 56a of the power supply line 56. The power supply antenna 90 includes a ring-shaped antenna main body 94 disposed between the outer conductor 52 and the inner conductor 53 of the coaxial line 51, a first pole 92 that connects the antenna main body 94 and the inner conductor 56a of the power supply line 56, and a second pole 93 that connects the antenna main body 94 and the inner conductor 53 of the coaxial line 51.

When the power supply antenna 90 radiates electromagnetic waves, the electromagnetic waves are supplied to the space between the outer conductor 52 and the inner conductor 53, and then propagate toward the antenna part 45. By reflecting the electromagnetic waves radiated from the power supply antenna 90 from the reflecting plate 58, the maximum electromagnetic waves are transmitted into the coaxial line 51.

When the frequency of the electromagnetic waves is 860 MHz, it is preferable to provide a slow retardation member 59 made of a dielectric between the reflecting plate 58 and the power supply antenna 90, as illustrated in FIG. 4. If the frequency of the electromagnetic waves is a high frequency such as 2.45 GHz or the like, the slow retardation member 59 may not be provided.

The antenna part 45 is disposed at the tip end of the coaxial line 51, and includes a planar slot antenna 81, a wave retardation member 82, and an electromagnetic wave transmitting window 110b. The planar slot antenna 81 has planar slots 81a for radiating electromagnetic waves. The wave retardation member 82 is made of a dielectric and is disposed on the rear surface (upper surface) of the planar slot antenna 81. A columnar member 82a made of a conductor, which is connected to the inner conductor 53, penetrates through the center of the wave retardation member 82. The columnar member 82a is connected to the planar slot antenna 81. The planar slot antenna 81 has a disc shape with a diameter greater than that of the outer conductor 52 of the coaxial line 51. The lower end of the outer conductor 52 extends to the planar slot antenna 81, and the wave retardation member 82 and the planar slot antenna 81 are covered with the outer conductor 52. The electromagnetic wave transmitting window 110b is fitted into the frame 110a of the plate-shaped member 110 and disposed at the tip end of the planar slot antenna 81, as described above.

The electromagnetic waves transmitted through the coaxial line 51 are radiated from the slots 81a of the planar slot antenna 81. The number, arrangement, and shape of the slots 81a are appropriately set such that the electromagnetic waves are efficiently radiated. A dielectric may be inserted into the slots 81a.

The wave retardation member 82 has a dielectric constant greater than that of the vacuum, and is made of, for example, quartz, ceramic, fluorine-based resin such as polytetrafluoroethylene, or polyimide-based resin. The wave retardation member 82 has a function of reducing the size of the antenna by shortening the wavelength of the electromagnetic waves compared to that in the vacuum. The phase of the electromagnetic waves can be adjusted by changing the thickness of the wave retardation member 82, and the thickness of the wave retardation member 82 is adjusted such that the planar slot antenna 81 can be located at the antinode position of the standing wave. Accordingly, the reflection can be minimized, and the radiation energy of the planar slot antenna 81 can be maximized.

The electromagnetic wave transmitting window 110b is made of a dielectric, and transmits the electromagnetic waves radiated from the slots 81a of the planar slot antenna 81 to the chamber 1. The electromagnetic wave transmitting window 110b can be made of the same dielectric as that of the wave retardation member 82.

[Tuner]

Next, the tuner 60 will be described in detail.

The tuner 60 forming a part of an electromagnetic wave transmission path, and matches the impedance on the power supply side (the transmission cable or the like) and the impedance on the load side (the plasma or the like). In other words, the power supply side is normally designed to have a pure resistance output of 50Ω, so that the tuner 60 is adjusted such that the impedance on the load side including the tuner 60 becomes 50Ω. Accordingly, the power can be efficiently supplied without reflection.

As described above, the tuner 60 includes the coaxial line 51, the first dielectric constant changing material 71 and the second dielectric constant changing material 72 whose dielectric constants is changeable, and the first power supply portion 73 and the second power supply portion 74 for supplying power to the first dielectric constant changing material 71 and the second dielectric constant changing material 72, respectively. The dielectric constants of the first dielectric constant changing material 71 and the second dielectric constant changing material 72 can be changed by adjusting the power supplied from the first power supply part 73 and the second power supply portion 74, and changing the applied electric field.

Since the cylindrical inner conductor 53 and the cylindrical outer conductor 52 are coaxially formed in the coaxial line 51, the cross section of the space between the inner conductor 53 and the outer conductor 52 has a ring shape. The first dielectric constant changing material 71 and the second dielectric constant changing material 72 are provided to fill the space between the inner conductor 53 and the outer conductor 52 in the horizontal cross section of the coaxial line 51, and have a ring shape. Further, the first dielectric constant changing material 71 and the second dielectric constant changing material 72 are arranged at intervals in the line length direction of the coaxial line 51.

The first power supply portion 73 for applying an electric field to the first dielectric constant changing material 71 includes a variable DC power supply 75 and a power supply line 77, and applies a voltage from the variable DC power supply 75 to the first dielectric constant changing material 71. The second power supply portion 74 for applying an electric field to the second dielectric constant changing material 72 includes a variable DC power supply 76 and a power supply line 78, and applies a voltage from the variable DC power supply 76 to the second dielectric constant changing material 72. Specifically, the power supply line 77 connects the anode of the variable DC power supply 75 and the inner portion of the first dielectric constant changing material 71 and the cathode of the variable DC power supply 75 and the outer portion of the first dielectric constant changing material 71. The power supply line 78 connects the anode of the variable DC power supply 76 and the inner part of the second dielectric constant changing material 72 and the cathode of the variable DC power supply 76 and the outer part of the second dielectric constant changing material 72. Further, the power supply lines 77 and 78 are connected to the inner portion of the first dielectric constant changing material 71 and the inner portion of the second dielectric constant changing material 72, respectively, through the inner portion of the inner conductor 53.

Figure 5:
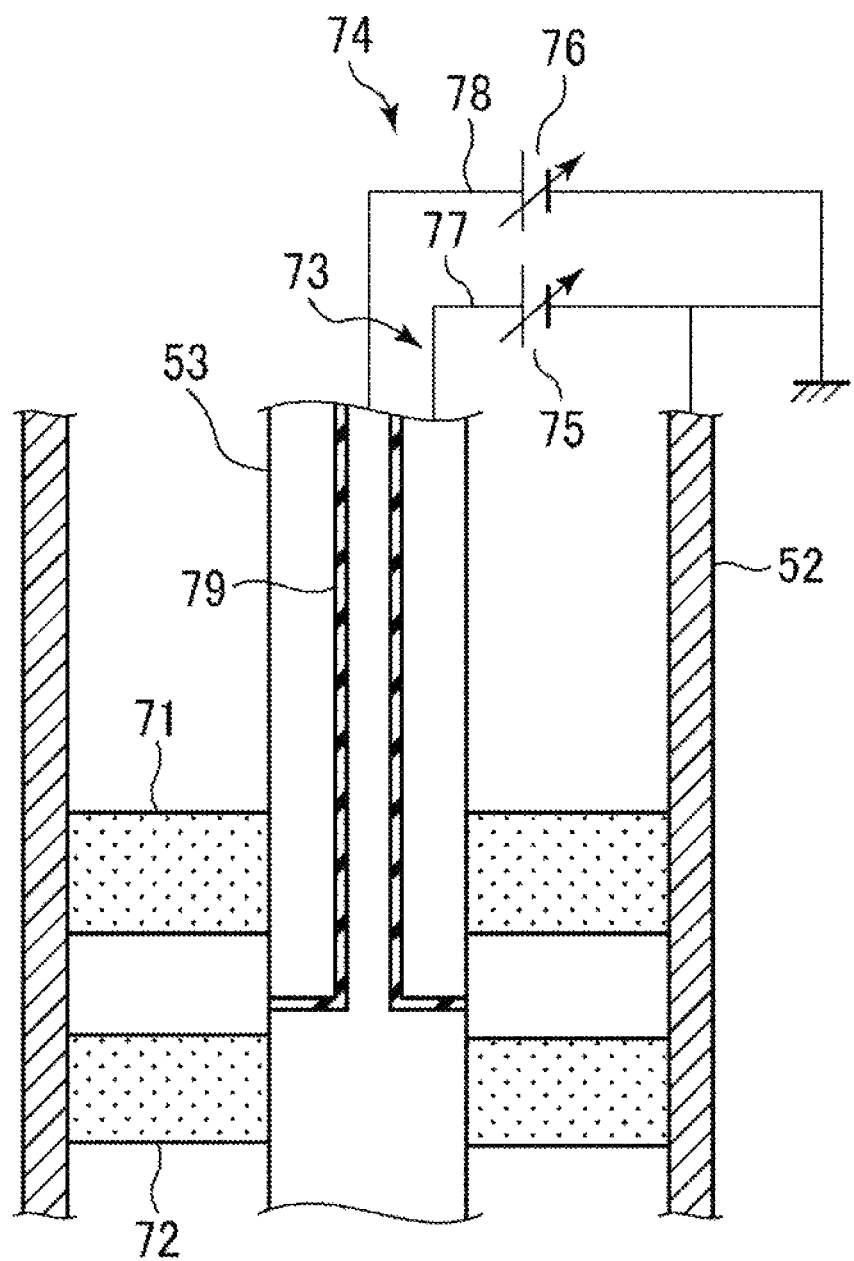
FIG. 5 is a cross-sectional view showing another power supply technique for supplying power to a first dielectric constant changing material and a second dielectric constant changing material.

Further, as shown in FIG. 5, the power may be supplied to the first dielectric constant changing material 71 and the second dielectric constant changing material 72 through the inner conductor 53 and the outer conductor 52. In that case, the inner conductor 53 is configured such that the portion corresponding to the first dielectric constant changing material 71 and the portion corresponding to the second dielectric constant changing material 72 are insulated by the insulating member 79, and the outer conductor 52 is grounded.

By providing the first dielectric constant changing material 71 and the second dielectric constant changing material 72 in the electromagnetic wave transmission path and changing the dielectric constants thereof, the impedance on the load side including the tuner 60 can be adjusted to be matched with the impedance on the power supply side. In this case, when $\lambda_{eff}$ indicates the effective wavelength at the maximum dielectric constant, the first dielectric constant changing material 71 and the second dielectric constant changing material 72 preferably have a thickness of $\lambda_{eff}/4$. However, the thickness may not be exactly $\lambda_{eff}/4$ and may be about $\lambda_{eff}/4$.

Figure 6:
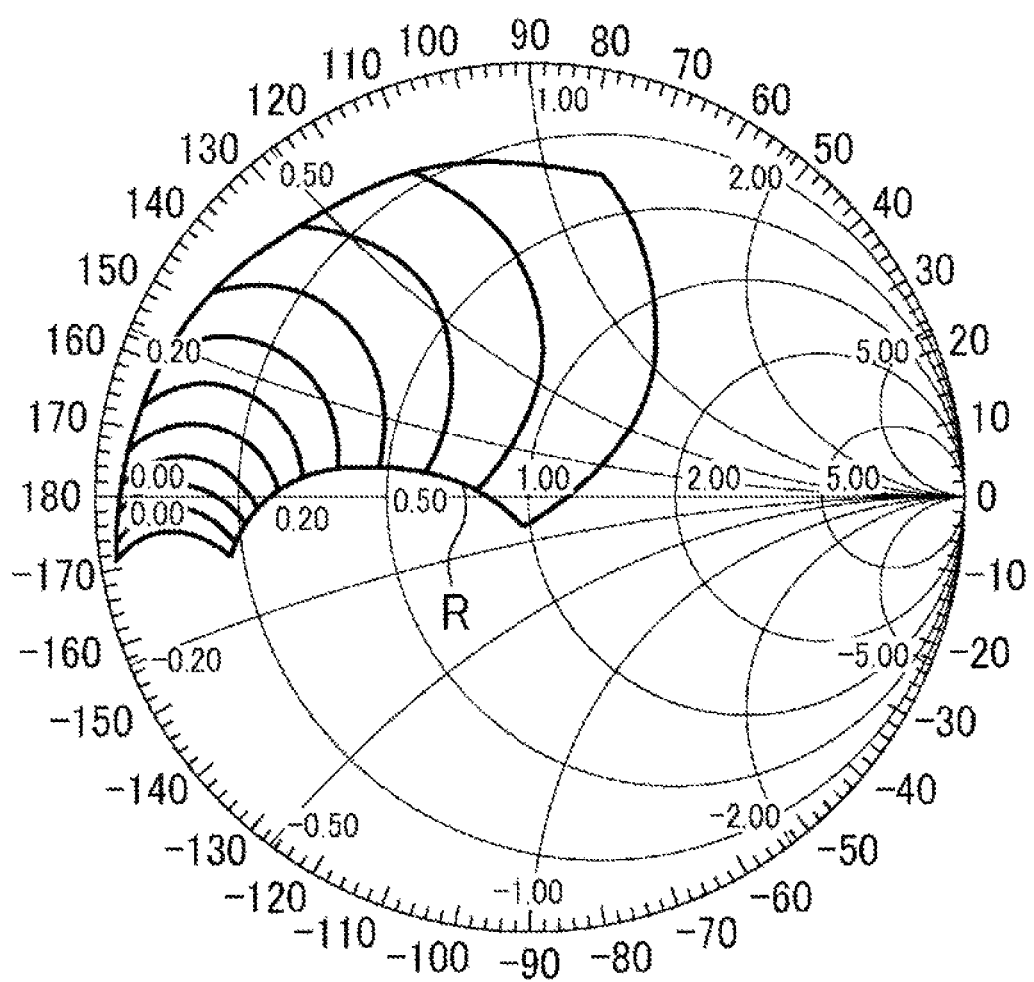
FIG. 6 shows a Smith chart for explaining impedance matching.

The impedance matching state at this time can be represented by the Smith chart. In the Smith chart that is a circular diagram showing complex impedance shown in FIG. 6, the horizontal axis represents a real number (resistance) component of the impedance, and the vertical axis represents an imaginary number (reactance) component of the impedance. The center (origin) in the drawing is the matching point where the impedance on the load side is matched with the impedance on the power supply side. The impedance on the load side exists at any position on the Smith chart, and FIG. 6 shows an example of a matching range R of the impedance on the load side. In the case of performing impedance matching using a dielectric constant changing material as in the present embodiment, the matching range R exists, although it has a distorted shape as shown in FIG. 6, and the impedance matching can be performed within that range.

In order to ensure a sufficient matching range, the distance d1 between the first dielectric constant changing material 71 and the second dielectric constant changing material 72 is preferably within a range of $\lambda_o/16$ to $\lambda_o/4\lambda$ when $\lambda_o$ indicates a free space wavelength.

Figure 7B:
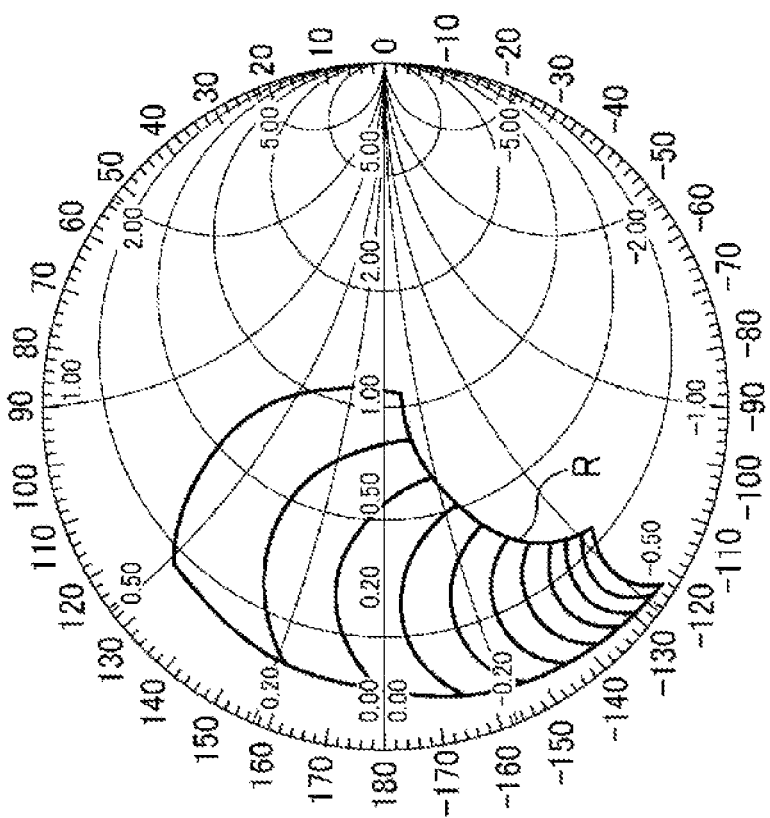
FIGS. 7A and 7B show matching ranges on the Smith charts in the case where a distance d2 between a second dielectric constant changing material 72 and a wave retardation member 82 is 10 mm and in the case where the distance d2 therebetween is 34 mm.
Figure 7A:
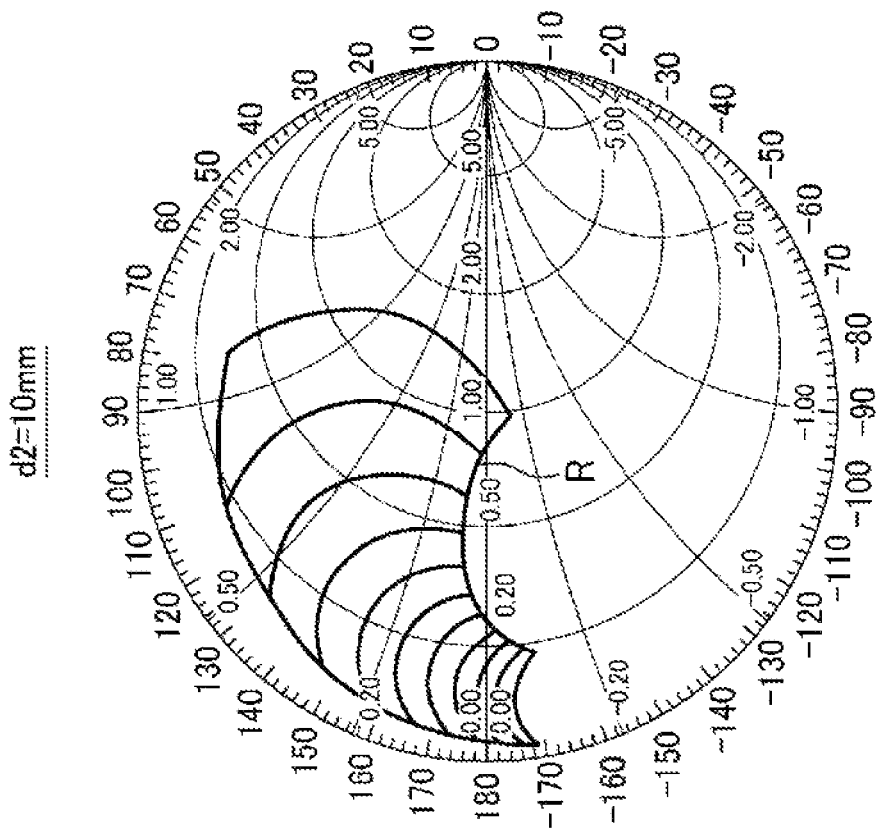

The positions of the first dielectric constant changing material 71 and the second dielectric constant changing material 72 can be adjusted while maintaining the distance d1. By adjusting the positions of the first dielectric constant changing material 71 and the second dielectric constant changing material 72 and fixing them to desired positions, the matching range R can be shifted, and the matching range R can be adjusted depending on the specifications. Specifically, as shown in FIG. 7, the matching range R on the Smith chart can be rotated by changing the distance d2 between the second dielectric constant changing material 72 and the wave retardation member 82. FIG. 7A shows a case where the distance d2 is 10 mm, and FIG. 7B shows a case where the distance d2 is 34 mm.

Figure 8:
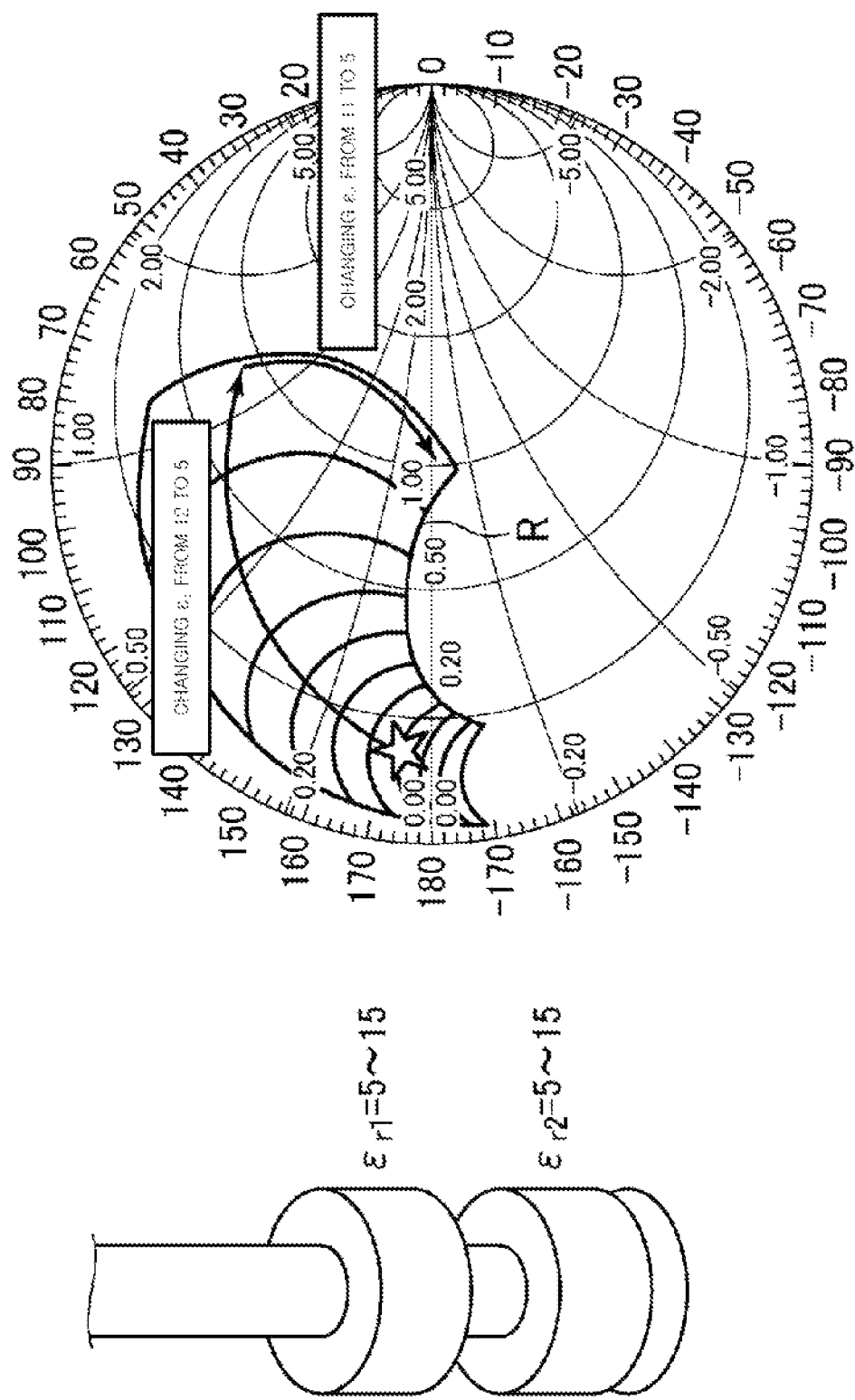
FIG. 8 shows an example of impedance matching using a tuner of the first embodiment.

FIG. 8 shows an example of impedance matching using the tuner 60. Here, both a dielectric constant $\varepsilon_{r1}$ of the first dielectric constant changing material 71 and a dielectric constant $\varepsilon_{r2}$ of the second dielectric constant changing material 72 in the case of supplying electromagnetic waves (with a frequency of 860 MHz, for example) from the plasma source 2 can vary within a range of 5 to 15, for example. The first dielectric constant changing material 71 and the second dielectric constant changing material 72 have a thickness of $\lambda_{eff}/4$, and the distance d1 therebetween is $\lambda_o/12$. The distance d2 between the second dielectric constant changing material 72 and the wave retardation member 82 is 10 mm. The position of the initial load impedance on the Smith chart is indicated by an asterisk, and the impedance reaches the matching point by changing the dielectric constant $\varepsilon_{r2}$ from 12 to 5 and then changing the dielectric constant $\varepsilon_{r1}$ from 11 to 5. The matching can be performed by changing the dielectric constant of one dielectric constant changing materials and then changing the dielectric constant of the other dielectric constant changing material as in the case of changing the dielectric constant of the second dielectric constant changing material 72 and then changing the dielectric constant of the first dielectric constant changing material 71. However, the matching can also be performed by alternately changing the dielectric constants thereof multiple times. Alternatively, both methods may be combined. For example, the matching can be performed by changing the dielectric constant of one of the dielectric constant changing materials and then changing the dielectric constant of the other dielectric constant changing material so that the impedance can become close to the matching point and, then, by alternatively changing the dielectric constants of the dielectric constant changing materials.

The first dielectric constant changing material 71 and the second dielectric constant changing material 72 may be the same material or different materials. For example, nematic liquid crystals can be used for the first dielectric constant changing material 71 and the second dielectric constant changing material 72. The nematic liquid crystals have uniaxial anisotropy because the long axes of rod-shaped molecules are oriented in a fixed direction (dipole direction). However, they do not form layers, and there is no regularity in the position of the molecular center of gravity. Since each molecule is likely to move in the long axis direction, it has low viscosity and high fluidity, and the orientation can be changed at a high speed by an electric field or a magnetic field. In addition, since the rod-shaped molecules have uniaxial anisotropy, the dielectric constant in the frequency range of 30 MHz to 3 THz also has uniaxial anisotropy as shown in the following Eq. (1), and the effective dielectric constant $\varepsilon_{\textit{eff}}$ has a value shown in the following Eq. (2).

[Equation 1]

$$\vec{\varepsilon} = \begin{pmatrix} \varepsilon_{\parallel} & 0 & 0 \\ 0 & \varepsilon_{\parallel} & 0 \\ 0 & 0 & \varepsilon_{\perp} \end{pmatrix} \quad (1)$$

$$\varepsilon_{\textit{eff}} = \sqrt{|\varepsilon_{\parallel} \cos \theta|^2 + |\varepsilon_{\perp} \sin \theta|^2} \quad (2)$$

As the orientation changes at a high speed as described above, the dielectric constant also changes at a high speed, which makes it possible to perform the impedance matching at a high speed by changing the dielectric constant. The nematic liquid crystals have been widely used in conventional display devices because they have low viscosity, high fluidity, and high-speed responsiveness as described above. However, there is no example in which they are applied to impedance matching.

The nematic liquid crystals may include azo compounds, azoxy compounds, azomethine compounds, biphenyl compounds, phenylcyclohexane compounds, ester compounds, pyrimidine compounds, and the like. Specifically, the nematic liquid crystals may include p-azoxyanisole, methoxy (butyl)azoxybenzene, p-methoxybenzylidene-p-butylaniline, and the like.

Figure 9:
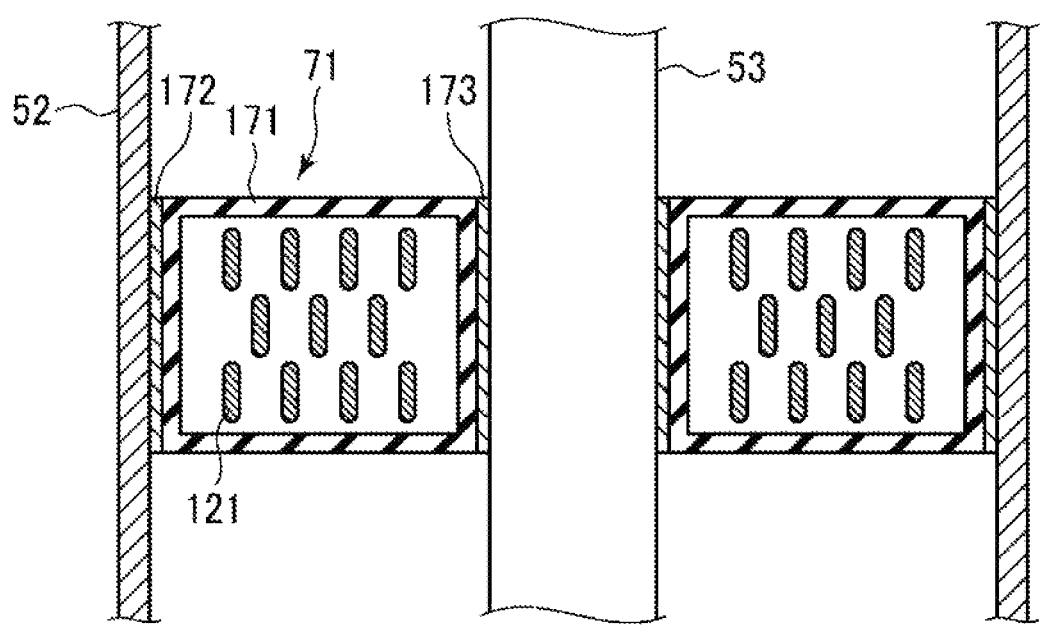
FIG. 9 is a cross-sectional view showing the first dielectric constant changing material using nematic liquid crystals.

FIG. 9 is a cross-sectional view showing the first dielectric constant changing material 71 using nematic liquid crystals. In this example, the first dielectric constant changing material 71 is formed by filling nematic liquid crystals 121 in a casing 171 made of an insulator. A first electrode 172 is formed at a portion of the casing 171 that is in contact with the outer conductor 52, and a second electrode 173 is formed at a portion of the casing 171 that is in contact with the inner conductor 53. A voltage is applied to the gap between the first electrode 172 and the second electrode 173.

Figure 10A:
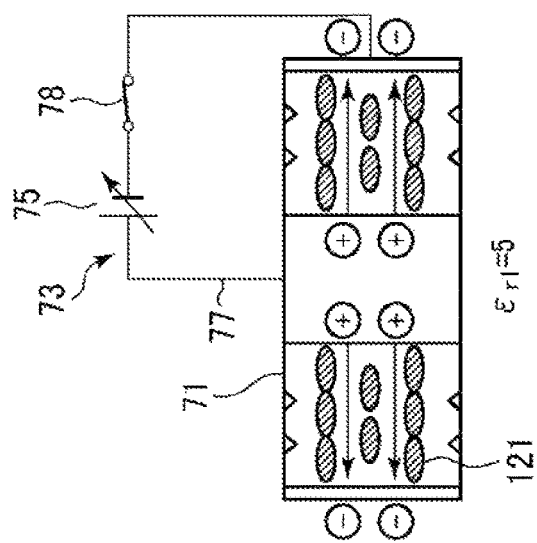
FIGS. 10A to 10C show changes in orientation due to voltage application in the case of using nematic liquid crystals for the first dielectric constant changing material and dielectric constants at that time.
Figure 10B:
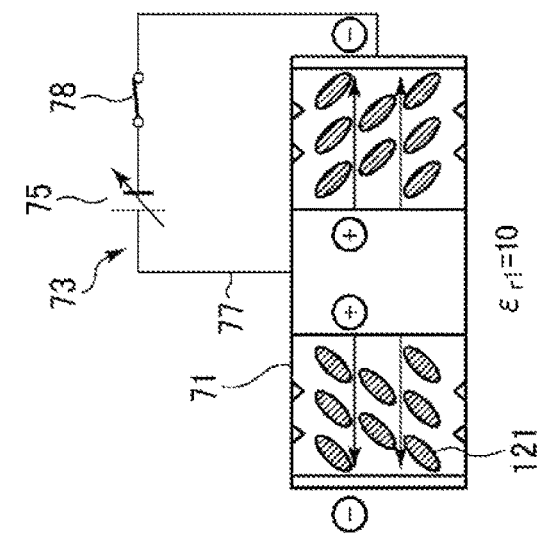
Figure 10C:
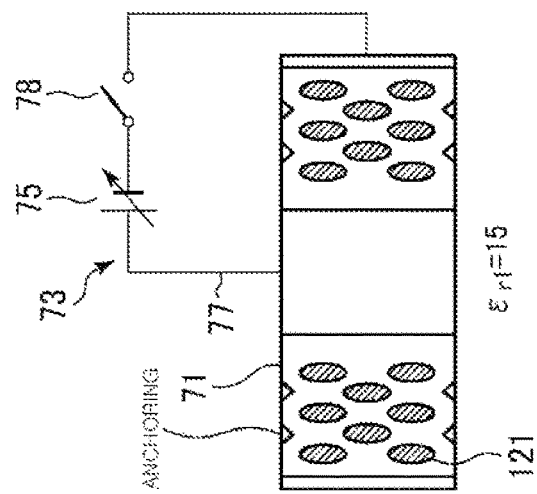

FIGS. 10A to 10C show changes in orientation due to voltage application in the case of using nematic liquid crystals for the first dielectric constant changing material 71 and dielectric constants at that time. In FIGS. 10A to 10C, a reference numeral 78 denotes a switch. The dielectric constant $\varepsilon_{r1}$ is the effective dielectric constant in the case of supplying electromagnetic waves (with a frequency of 860 MHz, for example) from the plasma source 2. FIG. 10A shows a state in which no voltage is applied. In that case, the dipoles of the molecules of the nematic liquid crystals 121 are anchored in the vertical direction. The dielectric constant $\varepsilon_{r1}$ at this time is 15. FIG. 10B shows a state in which the directions of the dipoles of the nematic liquid crystals 121 are oriented at 45° by applying a voltage, and the dielectric constant εr1 at this time is 10. FIG. 10C shows a state in which the directions of the dipoles of the nematic liquid crystals 121 are oriented to be parallel to the voltage application direction by applying a higher voltage, and the dielectric constant $\varepsilon_{r1}$ at this time is 5. The effective dielectric constant can be adjusted by controlling the directions of the dipoles of the nematic liquid crystals by a voltage (electric field).

[Operation of Plasma Processing Apparatus]

Next, the operation of the plasma processing apparatus 100 configured as described above will be described.

First, the substrate W is loaded into the chamber 1 and placed on the stage 11. Then, a plasma generating gas such as Ar gas is introduced from the gas supply source 27 into the chamber 1 through the line 28 and the gas inlet member 26, and the electromagnetic waves are introduced into the chamber 1 from the plasma source 2 to produce plasma by the electric field.

After plasma is produced, the processing gas is injected into the chamber 1 from the gas supply source 27 through the line 28 and the gas inlet member 26. The injected processing gas is excited by the plasma of the plasma generating gas and turned into plasma, and the substrate W is subjected to plasma processing such as film formation, etching, or the like by the plasma of the processing gas.

In producing the plasma, in the plasma source 2, the electromagnetic waves oscillated by the oscillator 32 of the electromagnetic wave output part 30 are amplified by the amplifier 33 and then distributed by the distributor 34 to a plurality of paths. The distributed electromagnetic waves are guided to the electromagnetic wave supply parts 40. In the electromagnetic wave supply parts 40, the powers distributed to a plurality of paths are individually amplified by the main amplifier 48 constituting a solid state amplifier and are supplied to the electromagnetic wave supply mechanism 41. The electromagnetic waves supplied to the electromagnetic wave supply mechanism 41 are radiated from the slots 81a of the planar slot antenna 81, and pass through the electromagnetic wave transmitting window 110b. Then, the electromagnetic waves reach the chamber 1 and are spatially combined. After the plasma is produced by the electric field of the electromagnetic waves supplied into the chamber 1, the electromagnetic waves radiated from the planar slot antenna 81 are continuously supplied to the plasma.

The electromagnetic waves are supplied from the side surface of the coaxial line 51 to the electromagnetic wave supply mechanism 41 through the power supply line 56. In other words, the electromagnetic waves propagating from the power supply line 56 are supplied from the power supply antenna 90 of the power supply port 54 disposed on the side surface of the coaxial line 5 to the coaxial line 51 that is a part of the electromagnetic wave transmission path and is one of the components of the tuner 60. The power supply antenna 90 radiates electromagnetic waves in the coaxial line 51 to form standing waves. An induced magnetic field is generated along the outer wall of the inner conductor 53 by the standing waves, so that an induced electric field is generated. Due to the chain reaction thereof, the electromagnetic waves propagate through the coaxial line 51 and are guided to the antenna part 45. However, this is merely an example, and the power supply method is not limited thereto.

In this case, the impedance is automatically matched by the tuner 60, and the electromagnetic waves are supplied to the plasma in the chamber 1 in a state where there is substantially no power reflection. In other words, in order to efficiently supply the electromagnetic waves from the power supply 31 to the plasma in the chamber 1 in a state where there is substantially no power reflection, the impedance on the power supply side and the impedance on the load side are matched by the tuner 60.

In this case, the following impedance matching method is performed.

As described above, in a state where the tuner 60 is disposed to form a part of the electromagnetic wave transmission path, first, the positions of the first dielectric constant changing material 71 and the second dielectric constant changing material 72 are adjusted while maintaining the distance d1 therebetween, and they are fixed to the adjusted positions. Accordingly, the matching range can be adjusted depending on the specifications. Specifically, the distance d2 between the second dielectric constant changing material 72 and the wave retardation member 82 is adjusted.

Next, the dielectric constants of the first dielectric constant changing material 71 and the second dielectric constant changing material 72 are changed within the adjusted matching range to match the impedance. Specifically, the impedance is made to reach the matching point on the Smith chart by changing the dielectric constant of one of the dielectric constant changing materials and then changing the dielectric constant of the other dielectric constant changing material, or by alternately changing the dielectric constants thereof multiples times, or by combining both methods, as described in FIG. 8.

Conventionally, as described in Patent Document 1, the impedance matching using the tuner was performed by moving two slugs made of a dielectric on the coaxial line that is a part of the transmission path. However, when the impedance matching is performed in such a manner, a mechanical driving part is required, which causes consumption of members and shortens the maintenance cycle. Further, in the case of mechanical driving, the impedance matching time is about 1 sec, which is a low matching speed, so that it may be difficult to respond to the impedance change during plasma generation. In particular, plasma ALD requires an extremely short matching time such as msec order or μsec order, which cannot be handled by conventional tuners. Hence, it was difficult to effectively prevent power reflection during plasma generation, and the power efficiency was not sufficient.

On the other hand, in the present embodiment, the tuner 60 including the first dielectric constant changing member 71 and the second dielectric constant changing member 72 disposed in the coaxial line 51 that is a part of the electromagnetic wave transmission path is used, and the impedance matching is performed by adjusting the dielectric constants thereof. Therefore, the impedance matching can be performed without using a mechanical driving part, so that mechanical consumption of members is less likely to occur. Further, the matching speed is high because only the dielectric constants are changed.

In particular, in the case of using nematic liquid crystals for the first dielectric constant changing material 71 and the second dielectric constant changing material 72, the fluidity is high due to low viscosity, and the orientation of the long axes direction of the rod-shaped molecules (directions of dipoles) can be changed at a high speed by an electric field or the like. Therefore, the dielectric constants can be changed at a high speed, and the impedance matching can be performed at a high speed.

Second Embodiment

Next, a second embodiment will be described.

In the second embodiment. The basic configuration of the plasma processing apparatus is the same as that in the first embodiment except the configuration of the tuner.

Figure 11:
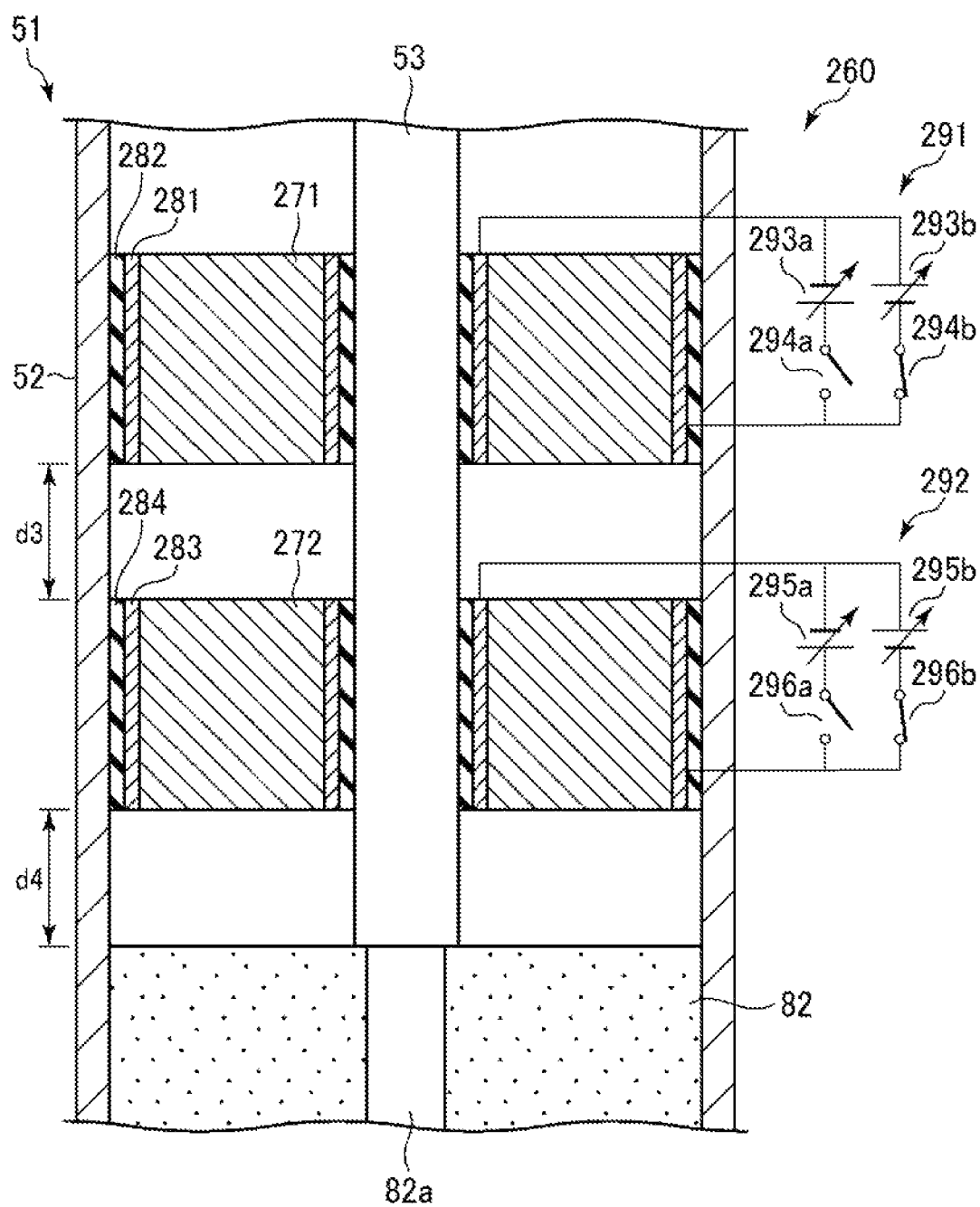
FIG. 11 is a cross-sectional view showing a tuner used in a second embodiment.

FIG. 11 is a cross-sectional view of main parts of the tuner of the second embodiment. In this embodiment, the tuner 260 includes the coaxial line 51, a first magnetic permeability changing material 271, a second magnetic permeability changing material 272, and a first temperature controller 281 and a second temperature controller 282 provided for the first magnetic permeability changing material 271 and the second magnetic permeability changing material 272, respectively. The coaxial line 51 is the same as that in the first embodiment, and includes the cylindrical outer conductor 52 and the cylindrical inner conductor 53.

A material whose magnetic permeability changes, for example, a magnetic substance such as ferrite, can be used for the first magnetic permeability changing material 271 and the second magnetic permeability changing material 272. The magnetic permeability of the magnetic material such as ferrite changes by changing a temperature. The first magnetic permeability changing material 271 and the second magnetic permeability changing material 272 may be the same material or different materials.

The first temperature controller 281 and the second temperature controller 283 are configured as temperature control elements such as Peltier elements or the like, and are disposed on the inner and outer circumferential surfaces of the first magnetic permeability changing material 271 and those of the second magnetic permeability changing material 272, respectively. A heat insulating member 282 thermally insulates the first temperature controller 281 from the outer conductor 52 and the inner conductor 53. A heat insulating member 284 thermally insulates the second temperature controller 283 form the outer conductor 52 and the inner conductor 53.

The first magnetic permeability changing material 271 and the second magnetic permeability changing material 272 have a ring shape. A structure in which the first magnetic permeability changing material 271 is provided with the first temperature controller 281 and the heat insulating member 282, and a structure in which the second magnetic permeability changing material 272 is provided with the second temperature controller 283 and the heat insulating member 284 also have a ring shape. These structures are provided to fill the space between the inner conductor 53 and the outer conductor 52 in the horizontal cross section of the coaxial line 51.

By supplying the power from the first power supply portion 291 to the first temperature controller 281, the temperature of the first magnetic permeability changing material 271 can be controlled. The first power supply portion 291 includes two power supplies 293a and 293b provided in parallel in opposite directions, and switches 294a and 294b for turning them on and off. By switching the power supplies 293a and 293b to change the current direction, the heating/cooling of the first temperature controller 281 can be switched. Similarly, by supplying the power from the second power supply portion 292 to the second temperature controller 283, the temperature of the second magnetic permeability changing material 272 can be controlled. The second power supply portion 292 includes two power supplies 295a and 295b provided in parallel in opposite directions, and switches 296a and 296b for turning them on and off. By switching the power supplies 295a and 295b to change the current direction, the heating/cooling of the second temperature controller 283 can be switched.

By providing the first magnetic permeability changing material 271 and the second magnetic permeability changing material 272 in the electromagnetic wave transmission path, and changing the magnetic permeabilities thereof, the impedance can be adjusted such that the impedance on the power supply side and the impedance on the load side are matched. At this time, the first magnetic permeability changing material 271 and the second magnetic permeability changing material 272 preferably have a thickness of $\lambda_{eff}/4$ when $\lambda_{eff}$ indicates the effective wavelength at the maximum magnetic permeability. However, the thickness may not be exactly $\lambda_{eff}/4$ and may be about $\lambda_{eff}/4$.

In order to ensure a sufficient matching range, the distance d3 between the first magnetic permeability changing material 271 and the second magnetic permeability changing material 272 preferably within a range of $\lambda_0/16$ to $\lambda_0/4$ when $\lambda_0$ indicates the free space wavelength. Further, the positions of the first magnetic permeability changing material 271 and the second magnetic permeability changing material 272 can be adjusted while maintaining the distance d3. The matching range can be shifted by adjusting the positions thereof and fixing them to desired positions, and the matching range can be adjusted depending on the specifications. Specifically, the matching range on the Smith chart can be rotated by changing the distance d4 between the second magnetic permeability changing material 272 and the wave retardation member 82.

In the actual impedance matching, first, the positions of the first magnetic permeability changing material 271 and the second magnetic permeability changing material 272 are adjusted while maintaining the distance d3 therebetween, and they are fixed to the adjusted positions. Accordingly, the matching range can be adjusted depending on the specifications. Specifically, the distance d4 between the second magnetic permeability changing material 272 and the wave retardation member 82 is adjusted.

Next, the magnetic permeabilities of the first magnetic permeability changing material 271 and the second magnetic permeability changing material 272 are changed within the adjusted matching range to match the impedance. Specifically, the impedance is made to reach the matching point on the Smith chart by independently changing the magnetic permeabilities of the magnetic permeability changing materials, or by alternately changing the magnetic permeabilities of the magnetic permeability changing materials, or by combining both methods, similarly to the case of changing the dielectric constants in the above-described first embodiment of FIG. 8.

As described above, in the present embodiment, the tuner 260 including the first magnetic permeability changing material 271 and the second magnetic permeability changing material 272 disposed in the coaxial line 51 that is a part of the electromagnetic wave transmission path is used, and the impedance matching is performed by adjusting the magnetic permeabilities thereof. Since the impedance matching can be performed without using a mechanical driving part, the mechanical consumption of members is less likely to occur. Further, in the present embodiment, the temperatures of the first and second magnetic permeability changing materials 271 and 272 are changed by the first and second temperature controllers 281 and 283 to change the magnetic permeabilities thereof, so that the impedance matching speed is lower than that in the case of changing the dielectric constants in the first embodiment in principle. However, it is possible to obtain a higher impedance matching speed compared to that in the conventional mechanical driving.

[Other Applications]

While the embodiments of the present disclosure have been described, the embodiments of the present disclosure are illustrative in all respects and are not restrictive. The above-described embodiments may be omitted, replaced, or changed in various forms without departing from the scope of the appended claims and the gist thereof.

For example, in the above embodiments, an example in which a plurality of electromagnetic wave supply mechanisms are provided has been described, but one electromagnetic wave supply mechanism may be provided. In the above embodiment, an example in which the inner conductor and the outer conductor of the coaxial line have a cylindrical shape, and the first and second dielectric changing materials and the first and second magnetic permeability changing materials have a ring shape has been described. However, the inner conductor and the outer conductor may have another cross-sectional shape such as a polygonal shape or the like as long as they have a tubular shape, and the first and second dielectric changing materials and the first and second magnetic permeability changing materials may have another shape such as a polygonal shape or the like as long as they have an annular shape. Further, although an example in which two dielectric changing materials and two magnetic permeability changing materials are provided has been described, the number of the dielectric changing materials and the number of the magnetic permeability changing materials may be three or more.

Further, in the above embodiments, an example in which a slot antenna having slots for radiating electromagnetic waves is used as an antenna has been described, but the present disclosure is not limited thereto.

DESCRIPTION OF REFERENCE NUMERALS

1: chamber, 2: plasma source, 41: electromagnetic wave supply mechanism, 45: antenna part, 51: coaxial line, 52: outer conductor, 53: inner conductor, 60, 260: tuner, 71, 72: dielectric constant changing material, 73, 74: power supply portion, 81: planar slot antenna, 81*a*: slot, 82: wave retardation member, 100: plasma processing apparatus, 110*b*: electromagnetic wave transmitting window, 271, 272: magnetic permeability changing material, 281, 283: temperature controller, 291, 292: power supply portion, W: substrate

The invention claimed is:

1. A tuner that forms a part of an electromagnetic wave transmission path for supplying electromagnetic waves from a power supply to a load, and that matches an impedance on a power supply side and an impedance on a load side, comprising:
a coaxial line including a cylindrical inner conductor and a cylindrical outer conductor disposed coaxially outside the inner conductor;
an annular first dielectric constant changing material disposed in a space between the inner conductor and the outer conductor of the coaxial line, and having a variable dielectric constant;
an annular second dielectric constant changing material spaced apart from the first dielectric constant changing material in a line length direction of the coaxial line, disposed in the space between the inner conductor and the outer conductor of the coaxial line, and having a variable dielectric constant;
a first power supply portion configured to supply power to the first dielectric constant changing material; and
a second power supply portion configured to supply power to the second dielectric constant changing material.

2. The tuner of claim 1, wherein the first dielectric constant changing material and the second dielectric constant changing material are provided to fill the space between the inner conductor and the outer conductor in a horizontal cross section of the coaxial line.

3. The tuner of claim 1, wherein the dielectric constants of the first dielectric constant changing material and the second dielectric constant changing material are changed by adjusting the powers supplied from the first power supply portion and the second power supply portion to change applied electric fields.

4. The tuner of claim 1, wherein the first dielectric constant changing material and the second dielectric constant changing material are made of nematic liquid crystals, and the dielectric constants of the first dielectric constant changing material and the second dielectric constant changing material are adjusted by changing orientation directions of dipoles of molecules of the nematic liquid crystals by adjusting the powers supplied from the first power supply portion and the second power supply portion to change applied electric fields.

5. The tuner of claim 1, wherein a thickness of the first dielectric constant changing material and the second dielectric constant changing material is ¼ of an effective wavelength at a maximum dielectric constant.

6. The tuner of claim 1, wherein a distance between the first dielectric constant changing material and the second dielectric constant changing material is within a range of $\lambda_0/16$ to $\lambda_0/4$, where $\lambda_0$ is a free space wavelength.

7. The tuner of claim 1, wherein positions of the first dielectric constant changing material and the second dielectric constant changing material are adjustable while maintaining the distance therebetween, and the first dielectric constant changing material and the second dielectric constant changing material are fixed to desired positions.

8. The tuner of claim 1, wherein the first dielectric constant changing material and the second dielectric constant changing material are in contact with the inner conductor and the outer conductor via electrodes.

9. The tuner of claim 1, wherein the space between the inner conductor and the outer conductor of the coaxial line has a ring-shaped cross section, and the first dielectric constant changing material and the second dielectric constant changing material have a ring shape corresponding to the horizontal cross section of the space.

10. A tuner that forms a part of an electromagnetic wave transmission path for supplying electromagnetic waves from a power supply to a load, and that matches an impedance on a power supply side and an impedance on a load side, comprising:
    a coaxial line including a cylindrical inner conductor and a cylindrical outer conductor disposed coaxially outside the inner conductor;
    an annular first magnetic permeability changing material disposed in a space between the inner conductor and the outer conductor of the coaxial line, and having a variable magnetic permeability;
    an annular second magnetic permeability changing material spaced apart from the first magnetic permeability changing material in a line length direction of the coaxial line, disposed in the space between the inner conductor and the outer conductor of the coaxial line, and having a variable magnetic permeability;
    a first temperature controller configured to adjust a temperature of the first magnetic permeability changing material; and
    a second temperature controller configured to adjust a temperature of the second magnetic permeability changing material.

11. The tuner of claim 10, wherein the first temperature controller and the second temperature controller are disposed on inner and outer circumferential surfaces of the first magnetic permeability changing material and inner and outer circumferential surfaces of the second magnetic permeability changing material, respectively, and the first temperature controller and the second temperature controller are in contact with the inner conductor and the outer conductor via heat insulating members.

12. The tuner of claim 10, wherein the first temperature controller and the second temperature controller are temperature control elements.

13. The tuner of claim 12, wherein the temperature control elements constituting the first temperature controller and the second temperature controller control temperatures of the first magnetic permeability changing material and the second magnetic permeability changing material by powers supplied from a first power supply portion and a second power supply portion.

14. The tuner of claim 10, wherein the first magnetic permeability changing material and the second magnetic permeability changing material are magnetic materials.

15. The tuner of claim 10, wherein a thickness of the first magnetic permeability changing material and the second magnetic permeability changing material is ¼ of an effective wavelength at a maximum magnetic permeability.

16. The tuner of claim 10, wherein a distance between the first magnetic permeability changing material and the second magnetic permeability changing material is within a range of $\lambda_0/16$ to $\lambda_0/4\lambda$, where $\lambda_0$ is a free space wavelength.

17. The tuner of claim 10, wherein positions of the first magnetic permeability changing material and the second magnetic permeability changing material are adjustable while maintaining a distance therebetween, and the first magnetic permeability changing material and the second magnetic permeability changing material are fixed to desired positions.

18. An impedance matching method for matching an impedance on a power supply side and an impedance on a load side, comprising:
    preparing a tuner including a coaxial line having a cylindrical inner conductor and a cylindrical outer conductor provided coaxially outside the inner conductor, an annular first dielectric constant changing material disposed in a space between the inner conductor and the outer conductor of the coaxial line and having a variable dielectric constant, and an annular second dielectric constant changing material that is spaced apart from the first dielectric constant changing material in a line length direction of the coaxial line and disposed in the space between the inner conductor and the outer conductor of the coaxial line, and having a variable dielectric constant, the tuner forming a part of an electromagnetic wave transmission path for supplying electromagnetic waves from the power supply side to the load side;
    adjusting positions of the first dielectric constant changing material and the second dielectric constant changing material while maintaining a distance therebetween and fixing the first dielectric constant changing material and the second dielectric constant changing material to desired positions; and
    matching an impedance by changing the dielectric constants of the first dielectric constant changing material and the second dielectric constant changing material.

19. The impedance matching method of claim 18, wherein said matching the impedance is performed by a first method in which the dielectric constant of one of the first dielectric constant changing material and the second dielectric constant changing material is changed and, then, the dielectric constant of the other dielectric constant changing material is changed, a second method in which the dielectric constants of the first dielectric constant changing material and the second dielectric constant changing material are alternately changed multiple times, or a third method in which the first method is performed to make an impedance close to a matching point and then the second method is performed.

* * * * *